(12) United States Patent
Loopstra et al.

(10) Patent No.: US 10,908,508 B2
(45) Date of Patent: *Feb. 2, 2021

(54) POSITION MEASUREMENT OF OPTICAL ELEMENTS IN A LITHOGRAPHIC APPARATUS

(71) Applicant: Carl Zeiss SMT GmbH, Oberkochen (DE)

(72) Inventors: Erik Loopstra, Huernheim (DE); Engelbertus Antonius Fransiscus Van Der Pasch, Oirschot (NL); Sascha Bleidistel, Aalen (DE); Suzanne Cosijn, Casteren (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/688,598

(22) Filed: Nov. 19, 2019

(65) Prior Publication Data

US 2020/0089126 A1  Mar. 19, 2020

Related U.S. Application Data

(63) Continuation of application No. 16/194,795, filed on Nov. 19, 2018, now Pat. No. 10,509,325, which is a (Continued)

(30) Foreign Application Priority Data

May 25, 2016 (DE) .................. 10 2016 209 167

(51) Int. Cl.
*G03F 7/20* (2006.01)
*G03F 9/00* (2006.01)
*G02B 17/06* (2006.01)

(52) U.S. Cl.
CPC ........ *G03F 7/70233* (2013.01); *G03F 7/7085* (2013.01); *G03F 7/70775* (2013.01); (Continued)

(58) Field of Classification Search
CPC ............ G03F 7/70233; G03F 7/70808; G03F 7/70833; G03F 7/7085
See application file for complete search history.

(56) References Cited

U.S. PATENT DOCUMENTS 10,509,325 B2 * 12/2019 Loopstra ............... G03F 9/7049
2004/0227107 A1   11/2004 Cox et al.
(Continued)

FOREIGN PATENT DOCUMENTS

WO    WO 2015/043682 A1    4/2015

OTHER PUBLICATIONS

International Search Report and Written Opinion for corresponding PCT Appl No. PCT/EP2017/062643, dated Sep. 18, 2017.
(Continued)

*Primary Examiner* — Steven Whitesell Gordon
(74) *Attorney, Agent, or Firm* — Fish & Richardson P.C.

(57) ABSTRACT

A lithographic apparatus includes a projection system which includes a plurality of optical elements configured to project a beam of radiation onto a radiation sensitive substrate. The lithographic apparatus also includes a metrology frame structure which includes a part of one or more optical element measurement systems to measure the position and/or orientation of at least one of the optical elements. The plurality of optical elements, a patterning device stage, and a substrate stage are arranged such that, in a two dimensional view on the projection system, a rectangle is defined such that it envelops the plurality of optical elements, the patterning device stage, and the substrate stage. The rectangle is as small as possible. The metrology frame structure is positioned within the rectangle.

21 Claims, 7 Drawing Sheets

Related U.S. Application Data continuation of application No. PCT/EP2017/062643, filed on May 24, 2017.

(52) U.S. Cl.
CPC ...... *G03F 7/70808* (2013.01); *G03F 7/70833* (2013.01); *G03F 9/7049* (2013.01); *G02B 17/0678* (2013.01)

(56) References Cited

U.S. PATENT DOCUMENTS

| | | |
|---|---|---|
| 2004/0227915 A1 | 11/2004 | Ohtsuka |
| 2009/0027644 A1 | 1/2009 | Zellner et al. |
| 2011/0170078 A1 | 7/2011 | Loopstra et al. |
| 2011/0194091 A1 | 8/2011 | Kwan et al. |
| 2015/0062596 A1 | 3/2015 | Kwan |
| 2016/0085061 A1 | 3/2016 | Schwab |
| 2018/0246416 A1 | 8/2018 | Schoenhoff |
| 2019/0086813 A1 | 3/2019 | Loopstra et al. |

OTHER PUBLICATIONS

German office action, with translation thereof, for corresponding DE Appl No. 10 2016 209 167.0, dated Mar. 2, 2017.

\* cited by examiner

POSITION MEASUREMENT OF OPTICAL ELEMENTS IN A LITHOGRAPHIC APPARATUS

CROSS-REFERENCE TO RELATED APPLICATIONS

The present application is a continuation of, and claims benefit under 35 USC 120 to, U.S. application Ser. No. 16/194,795, filed Nov. 19, 2018, which is a continuation of, and claims benefit under 35 USC 120 to, international application PCT/EP2017/062643, filed May 24, 2017, which claims benefit under 35 USC 119 of German Application No. 10 2016 209 167.0 filed on May 25, 2016. The entire disclosure of these applications are incorporated by reference herein.

TECHNICAL FIELD

The description herein relates to lithographic apparatuses and processes, and more particularly to a system and a method to measure a position and/or orientation of an optical element in a lithographic apparatus.

BACKGROUND

A lithographic apparatus can be used, for example, in the manufacture of integrated circuits (ICs) or other functional devices. In such a case, a patterning device (e.g., a mask) may contain or provide a pattern corresponding to an individual layer of the device ("design layout"), and this pattern can be transferred onto a target portion (e.g., including one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic apparatus, one target portion at a time. In one type of lithographic apparatus, the pattern on the entire patterning device is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various procedures such as etching, ion-implantation (doping), metallization, oxidation, chemo-mechanical polishing, etc., all intended to finish off the individual layer of the device. If several layers are used in the device, then some or all of these procedures or a variant thereof may be repeated for each layer. Eventually, a device will be present in each target portion on the substrate. If there is a plurality of devices, these devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

For example, US 2004/0227915 A1 relates generally to an optical system and an exposure apparatus having the same. More particularly, the disclosure of US 2004/0227915 A1 is applicable to an optical system to be used in a photolithographic process wherein light of very short wavelength, called extreme ultraviolet (EUV) light, is used to project a pattern of a reticle onto a wafer, for manufacture of semiconductor devices such as ICs. In order to produce a high-precision optical system, the optical elements within such an apparatus are desirably positioned and oriented very exactly, which is why the optical elements are typically measured relatively to a defined reference before or even during operation. Therefore, complex measurement systems need to be integrated into the lithographic apparatus which are typically mounted on one or more metrology (sensor) frame structures. It is known to arrange the parts of the measurement system, e.g., the individual sensors, around the optical elements to be measured. However, a drawback of the known solutions is the relatively huge dimension of such lithographic apparatuses, resulting from the surrounding metrology frame structure. Furthermore, the known frames are susceptible to vibrations and the commonly used multi-part designs of the metrology frame usually leads to increased measurement inaccuracy, as the positions of the several parts of the frame and thus the sensors which are mounted on the different parts of the frame relative to each other may be misaligned or rather prone to component tolerances.

SUMMARY

It is desirable to provide a lithographic apparatus with a projection system and a metrology frame structure to improve the performance of the projection system.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

In an embodiment the rectangle envelops all parts of the metrology frame structure, all parts of the optical elements, the patterning device stage and the substrate stage, i.e., none of these elements do overlap the rectangle.

As the metrology frame structure is positioned within the rectangle (which can also be called "outer rectangle"), i.e., close to the center of the lithographic apparatus, the metrology frame structure can be designed relatively small which can lead to a decreased size of the lithographic system. In addition the stiffness of the metrology frame structure and its resonance frequency can be increased, which can be important for nowadays demands on mirror positioning/measurement. Finally, even an improved measurement precision can be achieved due to the design and placement of the metrology frame structure according to the disclosure. As a consequence, the lithographic process can reach improved precision, compared to the known state of the art.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle. The plurality of optical elements is further arranged such that in the two dimensional view on the projection system an inner rectangle is defined such that it envelops the plurality of optical elements. The inner rectangle is further defined as small as possible, wherein the metrology frame structure is positioned within the inner rectangle.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage, wherein the two dimensional view is a view of the projection system wherein the path of the beam of radiation from the patterning device stage to the substrate stage can be seen in total. The rectangle is further defined as small as possible, wherein the metrology frame structure is positioned within the rectangle.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage, wherein the two dimensional view is a view of the projection system wherein a side view on the beam of radiation from the patterning device stage to the substrate stage can be seen. The rectangle is further defined as small as possible, wherein the metrology frame structure is positioned within the rectangle.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage, wherein the two dimensional view is a view on a plane in within the major part or the entire part of the beam of radiation proceeds from the patterning device stage to the substrate stage. The rectangle is further defined as small as possible, wherein the metrology frame structure is positioned within the rectangle.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle. The plurality of optical elements further includes an outer group of optical elements, the outer group of optical elements being positioned to surround the metrology frame structure.

It is understood that the feature "to surround" does not necessarily mean that the optical elements are arranged continuously, i.e., without gaps around the metrology frame structure. For example, three optical elements which are arranged on different sides of the metrology frame structure can already be enough to surround the metrology frame structure. Preferably the optical elements surround the metrology frame structure on all sides, i.e. preferably four optical elements are arranged to surround the metrology frame structure. The metrology frame structure can be surrounded by the optical elements in two or three dimensions.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle. The plurality of optical elements further includes an outer group of optical elements, the outer group of optical elements being positioned to surround the metrology frame structure, wherein the outer group of optical elements contains at least four, at least five, at least six, or at least seven of the optical elements.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle. The plurality of optical elements further includes an outer group of optical elements, the outer group of optical elements being positioned to surround the metrology frame structure, wherein the outer group of optical elements contains the majority or the entire plurality of optical elements.

Preferably the metrology frame structure is surrounded by all optical elements or is arranged within the inner rectangle as defined by the outer optical elements of the projection system, as in such a configuration the dimensions of the metrology frame structure can become even smaller.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle, and wherein the metrology frame structure includes an opening which is configured to let the beam of radiation pass through the metrology frame structure.

The opening in the metrology frame structure can be especially useful to design a system with a compact beam path which makes it possible to further decrease the dimensions of the lithographic apparatus. To provide a metrology frame structure with an opening, the metrology frame structure can for example be designed as a torus or a ring structure. However, in a basic design the beam path would—at least for the most part—surround the metrology frame structure.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle, and wherein the metrology frame structure includes an opening which is configured to let the beam of radiation pass through the metrology frame structure, and wherein the plurality of optical elements includes an inner group of optical elements, the inner group of optical elements being at least partly positioned within the opening of the metrology frame structure.

Although the structure of the projection system might become slightly more complex, positioning at least some (preferably a minor part), e.g., one, two, three, or four of the optical elements inside the metrology frame structure can reduce the packing density of the apparatus even more. The inner group of optical elements may include only one optical element. The inner group of optical elements may preferably be designed as grazing incidence mirrors.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements, wherein the one or more optical element measurement systems is/are configured to measure the position and/or orientation of the at least one of the optical elements optically. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements, wherein the majority or all optical element measurement systems are designed as interferometer systems. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

Especially interferometer systems can be used to precisely measure the position and/or orientation also for faraway optical elements. Thus by using interferometer measurement systems the design of the metrology frame structure can be more flexible, as the positions of such sensors can be chosen almost arbitrary.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements, wherein the metrology frame structure includes a part of two different types of optical element measurement systems. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements, wherein the metrology frame structure includes a part of two different types of optical element measurement systems, and wherein the optical element measurement systems are designed as one or more optical encoder systems and as one or more interferometer systems. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

Although the use of interferometers can be beneficial, optical encoder systems may preferably be applied when the optical elements to be measured are close to the sensor. Thus, also a design of the apparatus can be possible with only optical encoder systems used or a combination of an encoder system with an interferometer system. As a matter of course also other measurement systems, especially optical measurement systems alone or in combination with an encoder measurement system and/or an interferometer measurement system can be applied.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements, wherein the metrology frame structure includes a part of an encoder measurement system to measure the position of at least one of the optical elements and includes a part of an interferometer measurement system to measure the position and/or orientation of at least one other of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements, wherein the plurality of optical elements includes at least one, at least two, at least three, at least four, at least five, at least six, or at least seven grazing incidence mirrors. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

Especially a design of the projection system containing grazing incidence (GI) mirrors can be efficiently used for the disclosure, as the angles of incidence and reflection may be very flat for such mirrors and the beam path can then be led around the metrology frame structure. It can be appropriate for some applications to design all optical elements of the outer group of optical elements and/or the inner group of optical elements as grazing incidence mirrors.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements, wherein the majority or the entire plurality of optical elements is designed as grazing incidence mirrors. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle. The plurality of optical elements being supported by one or more force frame structures, wherein the force frame structures are independent of the metrology frame structure.

Thus, the metrology frame structure and the force frame structure can be designed independently from each other, meaning that the optical elements in a preferred embodiment are not mounted on the same frame as the sensors are mounted on. Such a design can be preferred as the optical elements and the sensors can be decoupled from mechanical forces, e.g., vibrations, and/or heat development. Also the flexibility to design both frames most efficiently and small can be increased.

According to an embodiment of the disclosure there is a lithographic apparatus, including a projection system including a plurality of optical elements, the plurality of optical elements configured to project a beam of radiation onto a radiation sensitive substrate. The lithographic apparatus also includes a metrology frame structure, wherein the metrology frame structure is a single frame, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

It can be advantageous to design the metrology frame structure as a single frame as this can increase its stiffness significantly. Thereby, the sensitivity to vibrations and uncertainty of the measurements due to part tolerances of the metrology frame structure can be suppressed.

According to an embodiment of the disclosure there is a lithographic apparatus, including a projection system including a plurality of optical elements, the plurality of optical elements configured to project a beam of radiation onto a radiation sensitive substrate. The lithographic apparatus also includes a metrology frame structure, wherein the metrology frame structure is a single frame, the single frame being a single part or including multiple parts rigidly or stiffly connected to each other, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

In general a single frame can be realized with a single part, i.e., monolithically. For applications where this is not possible due to the complexity of the frame or if the monolithic design would be uneconomical, the single frame can also be realized with multiple parts, but preferably with as little parts as possible, e.g., by two, three, four, or five parts, which are connected firmly together (for example secured by screws or the like) during manufacturing or installation of the apparatus. Thus, if composed and connected appropriately, even a multi-part frame can act as a single frame, according to the disclosure.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle, and wherein the metrology frame structure acts as a relative positioning reference for the optical element positioning measurement.

Whenever position and/or orientation of an optical element is being measured, a reference for the measurement is involved. Preferably the position and/or orientation of the reference is known reliably and stable. Therefore, the metrology frame structure can be an appropriate choice for some applications, especially if it is designed according to one or more aspects of the disclosure.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle, and wherein one of the optical elements acts as a relative positioning reference for the optical element positioning measurement.

Also one (or some) of the optical elements can be chosen as suitable reference to for some applications. Commonly, the optical elements have to be positioned and/or aligned relative to each other in order to guide the beam of radiation through the projection system which is why a reference within the projection system, e.g., one or more optical elements, can be sufficient. As also the force frame structure which carries the optical elements can be designed more stiffly and accurate according to the disclosure, the reliability of such a reference can be quite good. Some good candidates for the reference can be the first optical element in the projection system, e.g., a first mirror, receiving the beam directly from the patterning device (reticle). Another possible optical element to be used as reference can be the last optical element within the projection system, e.g., a last mirror, guiding the beam of radiation to the radiation sensitive substrate. However, almost any of the optical elements, e.g., mirrors, within the projection system can be used as a reference for the other optical elements, especially optical elements of the outer group of optical elements or optical elements of the inner group of optical elements. Preferably, the optical element with smallest stiffness is chosen as reference.

It should be noted that a reference, e.g., one of the optical elements, does not necessarily have to be a reference for all degrees of freedom. Thus, for example a first optical reference element can be a reference for a first part (section) of degrees of freedom and a second optical reference element can be a reference for a second part (section) of degrees of freedom. It is even possible to define a reference for each of the six degrees of freedom individually.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle, wherein an outer structure outside of the projection system acts as a relative positioning reference for the optical element positioning measurement.

Furthermore any outer or surrounding structure can act as reference, which can be a surrounding housing part, a wall or the like. This type of reference can especially be preferred if the projection system and/or the force frame structure and/or the metrology frame structure are stiffly or rigidly connected to the outer structure.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle, wherein the metrology frame structure is cooled.

According to an embodiment of the disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position and/or orientation of at least one of the optical elements, wherein at least one of the optical element measurement systems is designed as interferometer measurement system. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle. The interferometer measurement system being further designed for measurements in one or more degrees of freedom and/or includes one or more of the following features: relevant beam delivery, fiber feeding, beam splitting, beam bending, beam polarization cleaning, one or more beam adjustment manipulators and/or targets/provisions to control range, measurement beam wavelength tracking equipment, refractive index determination equipment, a zeroing system and/or local and/or global beam-shielding from external influences such as gas flows.

According to an embodiment of the disclosure there is a lithographic apparatus, including a projection system including a plurality of optical elements, the plurality of optical elements configured to project a beam of radiation onto a radiation sensitive substrate. The lithographic apparatus also includes a metrology frame structure, wherein the metrology frame structure has a resonance frequency of greater or equal than 400 Hz, including a part of one or more optical element measurement systems to measure the position and/or orientation of at least one of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an embodiment of the disclosure there is a lithographic apparatus, including a projection system including a plurality of optical elements, the plurality of optical elements configured to project a beam of radiation onto a radiation sensitive substrate. The lithographic apparatus further includes a patterning device metrology frame structure configured to enable measurement of a position and/or orientation of a patterning device and/or a patterning device table, i.e., the patterning device stage, and wherein the metrology frame structure further includes a part of a measurement system to measure the position and/or orientation of the patterning device metrology frame structure.

According to an embodiment of the disclosure there is a lithographic apparatus, including a projection system including a plurality of optical elements, the plurality of optical elements configured to project a beam of radiation onto a radiation sensitive substrate. The lithographic apparatus further includes a patterning device metrology frame structure configured to enable measurement of a position and/or orientation of a patterning device and/or a patterning device table, i.e., the patterning device stage, wherein the metrology frame structure further includes a part of a measurement system to measure the position and/or orientation of the patterning device metrology frame structure, and wherein the metrology frame structure further includes a part of a measurement system to measure the position and/or orientation of the substrate metrology frame structure to measure a first section of six degrees of freedom of the position and/or orientation of the patterning device metrology frame structure and the plurality of optical elements includes a further part of a measurement system to measure a second section of the six degrees of freedom of the position and/or orientation of the patterning device metrology frame structure.

According to an embodiment of the disclosure there is a lithographic apparatus, including a projection system including a plurality of optical elements, the plurality of optical elements configured to project a beam of radiation onto a radiation sensitive substrate. The lithographic apparatus further includes a substrate metrology frame structure configured to enable measurement of a position and/or orientation of the substrate and/or a substrate table, i.e., the substrate stage, and wherein the metrology frame structure further includes a part of a measurement system to measure the position and/or orientation of the substrate metrology frame structure.

According to an embodiment of the disclosure there is a lithographic apparatus, including a projection system including a plurality of optical elements, the plurality of optical elements configured to project a beam of radiation onto a radiation sensitive substrate. The lithographic apparatus further includes a substrate metrology frame structure configured to enable measurement of a position and/or orientation of the substrate and/or a substrate table, i.e., the substrate stage, and wherein the metrology frame structure further includes a part of a measurement system to measure the position and/or orientation of the substrate metrology frame structure to measure a first section of six degrees of freedom of the position and/or orientation of the substrate metrology frame structure and the plurality of optical elements includes a further part of a measurement system to measure a second section of the six degrees of freedom of the position and/or orientation of the substrate metrology frame structure.

According to an embodiment of the disclosure there is a lithographic apparatus, including a projection system including a plurality of optical elements, the plurality of optical elements configured to project a beam of radiation onto a radiation sensitive substrate, wherein the plurality of the optical elements includes at least seven, at least eight, or at least nine optical elements.

According to an embodiment of the disclosure there is a lithographic apparatus, including a projection system including a plurality of optical elements, the plurality of optical elements configured to project a beam of radiation onto a radiation sensitive substrate, wherein the plurality of the optical elements is reflective.

According to an embodiment of the disclosure there is a lithographic apparatus, including a projection system including a plurality of optical elements, the plurality of optical elements configured to project a beam of radiation onto a radiation sensitive substrate, wherein the projection system is designed for EUV radiation.

According to an embodiment of the disclosure there is a lithographic apparatus, including a projection system including a plurality of optical elements, the plurality of optical elements configured to project a beam of radiation onto a radiation sensitive substrate, wherein a gap distance from the metrology frame structure to the at least one optical element measured with the encoder measurement system is within five centimeters.

According to an embodiment of the disclosure there is a lithographic apparatus, including a projection system including a plurality of optical elements, the plurality of optical elements configured to project a beam of radiation onto a radiation sensitive substrate, wherein a gap distance from the metrology frame structure to the at least one optical element measured with the interferometer measurement system is five or more centimeters.

According to an embodiment of the disclosure there is a lithographic apparatus, including a projection system including a plurality of optical elements, the plurality of optical elements configured to project a beam of radiation onto a radiation sensitive substrate, wherein the metrology frame structure has a length of less than or equal to three meters.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

Features which have already been described before with regards to the lithographic apparatus may advantageously also be applied to the device manufacturing method and may also be combined with the features of the device manufacturing method as described in the following, if technically applicable. Advantages which have been described with regards to the lithographic apparatus may also come into effect with regards to the device manufacturing method and its features as described below.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle, wherein the plurality of optical elements is arranged such that in the two dimensional view on the projection system an inner rectangle is defined such that it envelops the plurality of optical elements, the inner rectangle being further defined as small as possible, wherein the metrology frame structure is positioned within the inner rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle, wherein the two dimensional view is a view of the projection system wherein the path of the beam of radiation from the patterning device stage to the substrate stage can be seen in total.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle, wherein the two dimensional view is a view of the projection system wherein a side view on the beam of radiation from the patterning device stage to the substrate stage can be seen.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle, wherein the two dimensional view is a view on a plane in within the major part or the entire part of the beam of radiation proceeds from the patterning device stage to the substrate stage.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the plurality of optical elements includes an outer group of optical elements, the outer group of optical elements being positioned to surround the metrology frame structure. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the plurality of optical elements includes an outer group of optical elements, the outer group of optical elements being positioned to surround the metrology frame structure, and wherein the outer group of optical elements contains at least four, at least five, at least six, or at least seven of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the plurality of optical elements includes an outer group of optical elements, the outer group of optical elements being positioned to surround the metrology frame structure, and wherein the outer group of optical elements contains the majority or the entire plurality of optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the metrology frame structure includes an opening which is configured to let the beam of radiation pass through the metrology frame structure. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the metrology frame structure includes an opening which is configured to let the beam of radiation pass through the metrology frame structure, and wherein the plurality of optical elements includes an inner group of optical elements, the inner group of optical elements being at least partly positioned within the opening of the metrology frame structure. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the one or more optical element measurement systems is/are configured to measure the position and/or orientation of the at least one of the optical elements optically. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the majority or all optical element measurement systems are designed as interferometer systems. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the metrology frame structure includes a part of two different types of optical element measurement systems. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position of at least one of the optical elements using a part of one or more optical element measurement systems mounted on a metrology frame structure, wherein the metrology frame structure includes a part of two different types of optical element measurement systems, the optical element measurement systems are designed as one or more optical encoder systems and as one or more interferometer systems. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the metrology frame structure includes a part of an encoder measurement system to measure the position and/or orientation of at least one of the optical elements and includes a part of an interferometer measurement system to measure the position and/or orientation of at least one other of the optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the plurality of optical elements includes at least one, at least two, at least three, at least four, at least five, at least six, or at least seven grazing incidence mirrors. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the majority or the entire plurality of optical elements is designed as grazing incidence mirrors. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, the plurality of optical elements being supported by one or more force frame structures, wherein the force frame structures are independent of the metrology frame structure. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, and wherein the metrology frame structure is a single frame. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, and wherein the metrology frame structure is a single frame, the single frame being a single part or including multiple parts rigidly or stiffly connected to each other. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the metrology frame structure acts as a relative positioning reference for the optical element positioning measurement. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein one of the optical elements acts as a relative positioning reference for the optical element positioning measurement. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein an outer structure outside of the projection system acts as a relative positioning reference for the optical element positioning measurement. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the metrology frame structure is cooled. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein at least one of the optical measurement systems is designed as interferometer measurement system. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle. The interferometer measurement system is designed for measurements in one or more degrees of freedom and/or includes one or more of the following features: relevant beam delivery, fiber feeding, beam splitting, beam bending, beam polarization cleaning, one or more beam adjustment manipulators and/or targets/provisions to control range, measurement beam wavelength tracking equipment, refractive index determination equipment, a zeroing system and/or local and/or global beam-shielding from external influences such as gas flows.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the metrology frame structure has a resonance frequency greater than or equal to 400 Hz. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, further including measuring the position and/or orientation of a patterning device metrology frame structure using a part of a measurement system mounted on the metrology frame structure, the patterning device metrology frame structure configured to enable measurement of a position and/or orientation of a patterning device and/or a patterning device table, i.e., the patterning device stage. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, further including measuring the position and/or orientation of a patterning device metrology frame structure using a part of a measurement system mounted on the metrology frame structure to measure a first section of six degrees of freedom of the position and/or orientation of the patterning device metrology frame structure and the plurality of optical elements includes a further part of a measurement system to measure a second section of the six degrees of freedom of the position and/or orientation of the patterning device metrology frame structure, the patterning device metrology frame structure configured to enable measurement of a position and/or orientation of a patterning device and/or a patterning device table, i.e., the patterning device stage. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, further including measuring the position and/or orientation of a substrate metrology frame structure using a part of a measurement system mounted on the metrology frame structure, the substrate metrology frame structure configured to enable measurement of a position and/or orientation of the substrate and/or a substrate table, i.e., the substrate stage. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, further including measuring the position and/or orientation of a substrate metrology frame structure using a part of a measurement system mounted on the metrology frame structure to measure a first section of six degrees of freedom of the position and/or orientation of the substrate metrology frame structure and the plurality of optical elements includes a further part of a measurement system to measure a second section of the six degrees of freedom of the position and/or orientation of the substrate metrology frame structure, the substrate metrology frame structure configured to enable measurement of a position and/or orientation of the substrate and/or a substrate table, i.e., the substrate stage. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the plurality of optical elements includes at least seven, at least eight, or at least nine optical elements. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the plurality of optical elements is reflective. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the beam is primarily EUV radiation. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein a gap distance from the metrology frame structure to the at least one optical element measured with the encoder measurement system is within five centimeters. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein a gap distance from the metrology frame structure to the at least one other optical element measured with the interferometer measurement system is five or more centimeters. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

According to an further embodiment of the disclosure there is a device manufacturing method, including the following steps: projecting a beam of radiation onto a radiation sensitive substrate via a plurality of optical elements of a projection system; measuring the position and/or orientation of at least one of the optical elements using a part of one or more optical element measurement systems mounted on a metrology frame structure, wherein the metrology frame structure has a length of less than or equal to three meters. The plurality of optical elements, a patterning device stage, and a substrate stage are arranged such that in a two dimensional view on the projection system a rectangle is defined such that it envelops the plurality of optical elements, the patterning device stage, and the substrate stage. The rectangle is further defined as small as possible, wherein the metrology frame structure is positioned within the rectangle.

This description contains another disclosure which also relates to lithographic apparatuses, a device manufacturing method and processes, and more particularly to a system and a method to measure a position and/or orientation of an optical element in a lithographic apparatus. The other disclosure is characterized by the following features.

According to the other disclosure there is provided a lithographic apparatus, including a projection system including a plurality of optical elements, the plurality of optical elements configured to project a beam of radiation onto a radiation sensitive substrate. The lithographic apparatus also includes a metrology frame structure, including a part of one or more optical element measurement systems to measure the position of at least one of the optical elements. The plurality of optical elements includes an outer group of optical elements, the outer group of optical elements being positioned to surround the metrology frame structure.

Features which have already been described before with regards to the first disclosure may advantageously also be applied to the other disclosure, if technically applicable. Advantages which have been described with regards to the first disclosure may also come into effect with regards to the other disclosure.

Hereinafter, some application examples of the disclosures will be described according to the drawings. The figures do show preferred application examples—and thus the features of the disclosure in combination. However, features of any of the application example can also be realized separated from the other features of the same application example and can thus be recombined with other features of the disclosure by the person skilled in the art without any difficulties.

DETAILED DESCRIPTION

Figure 1:
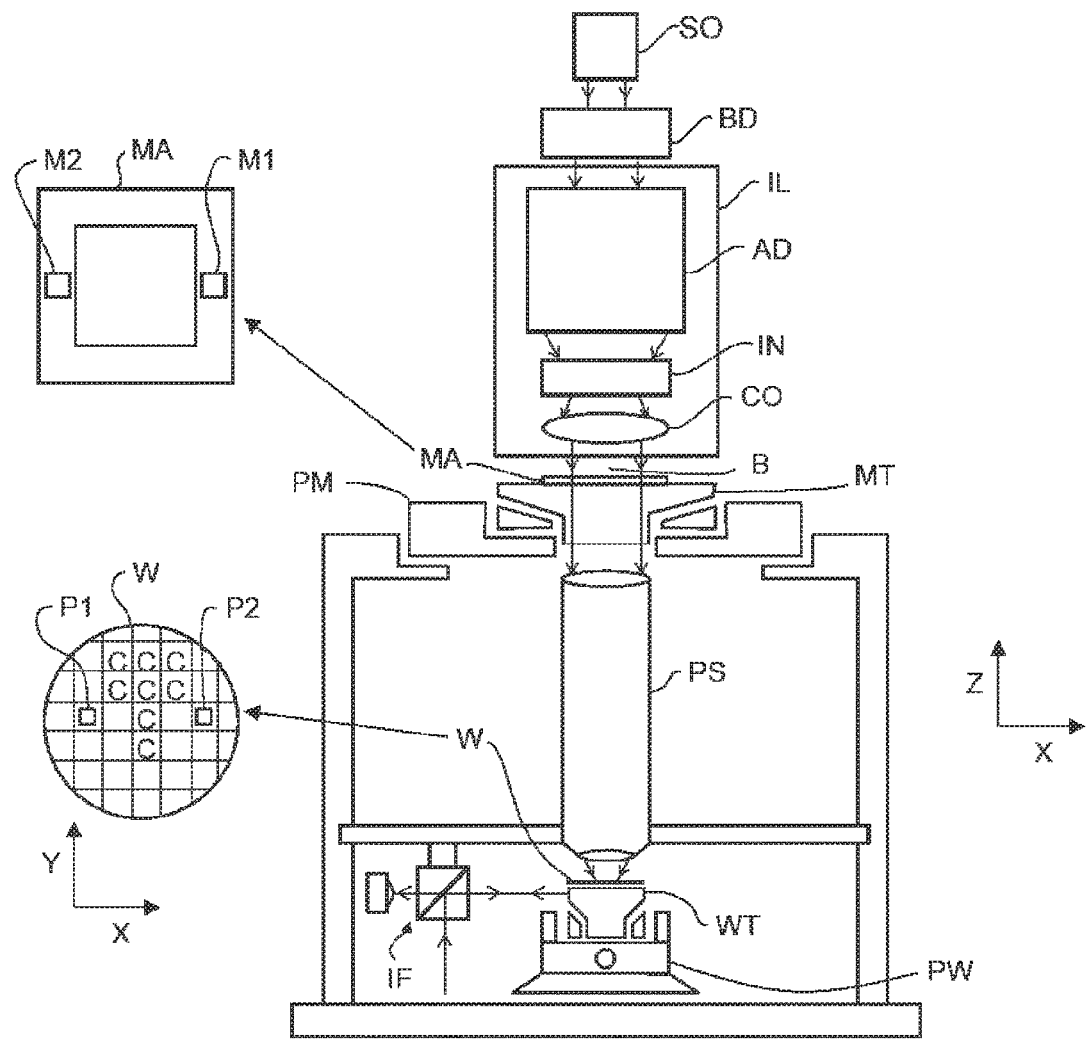
FIG. 1 is a schematic diagram of a lithographic apparatus.

FIG. 1 schematically depicts an exemplary lithographic apparatus. The apparatus includes:

an illumination system IL, to condition a beam B of radiation. In this particular case, the illumination system also includes a radiation source SO;

a first object table (e.g., mask table) MT provided with a patterning device holder to hold a patterning device MA (e.g., a reticle), and connected to a first positioner PM to accurately position the patterning device with respect to item PS;

a second object table (substrate table) WT provided with a substrate holder to hold a substrate W (e.g., a resist-coated silicon wafer), and connected to a second positioner PW to accurately position the substrate with respect to item PS;

a projection system PS (e.g., a refractive, catoptric or catadioptric optical system) to image an irradiated portion of the patterning device MA onto a target portion C (e.g., including one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The support structure MT holds the patterning device. The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as desired. The support structure MT may ensure that the patterning device is at a desired position, for example with respect to the projection system. Any use of the terms "reticle" or "mask" herein may be considered synonymous with the more general term "patterning device".

The source SO (e.g., a mercury lamp or excimer laser) produces a beam of radiation. This beam is fed into an illumination system (illuminator) IL, either directly or after having traversed a conditioner, such as a beam expander. The illuminator IL may include an adjuster AD configured to set the outer and/or inner radial extent (commonly referred to as σ-outer and σ-inner, respectively) of the intensity distribution in the beam. In addition, it will generally include various other components, such as an integrator IN and a condenser CO. In this way, the beam B impinging on the patterning device MA has a desired uniformity and intensity distribution in its cross-section.

It should be noted with regard to FIG. 1 that the source SO may be within the housing of the lithographic apparatus (as is often the case when the source SO is a mercury lamp, for example), but that it may also be remote from the lithographic apparatus, the radiation beam that it produces being led into the apparatus (e.g., with the aid of suitable directing mirrors BD); this latter scenario is often the case when the source SO is an excimer laser (e.g., based on KrF, ArF or $F_2$ lasing).

The beam B subsequently intercepts the patterning device MA, which is held on a patterning device table MT. Having traversed the patterning device MA, the beam B passes through the projection system PS, which focuses the beam B onto a target portion C of the substrate W. With the aid of the second positioner PW (and interferometer IF), the substrate table WT can be moved accurately, e.g., so as to position different target portions C in the path of the beam B. Similarly, the first positioner PM can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 1.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not involve any different imaging or process conditions than adjacent features.

The term "mask" or "patterning device" as employed in this text should be broadly interpreted as referring to any device that can be used to endow a radiation beam with a patterned cross-section such as to create a pattern in a target portion of the substrate (i.e., corresponding to a pattern that is to be created in a target portion of the substrate). It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The term "projection system" may also include components operating according to any of these design types for directing, shaping or controlling the projection beam of radiation, collectively or singularly.

Besides the classic mask (transmissive or reflective; binary, phase-shifting (alternating phase-shift, and attenuated phase-shift), hybrid, etc.), examples of other such patterning devices include:

a programmable mirror array. An example of such a device employs a matrix arrangement of small mirrors, each of which can be individually tilted so as to reflect an incoming radiation beam in different directions. The tilted mirrors impart a pattern in a radiation beam which is reflected by the mirror matrix. For example, such a device can have a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the undiffracted radiation can be filtered out of the reflected beam, leaving only the diffracted radiation behind; in this manner, the beam becomes patterned according to the addressing pattern of the matrix-addressable surface. The desired matrix addressing can be performed using suitable electronics.

a programmable LCD array.

The lithographic apparatus may be of a type having two or more support structures (e.g., two or more substrate support structures, such as substrate stages or substrate tables, and/or two or more support structures for patterning devices). In an apparatus with multiple substrate stages, all the substrate stages can be equivalent and interchangeable. In an embodiment, at least one of the multiple substrate stages is particularly adapted for exposure steps and at least one of the multiple substrate stages is particularly adapted for measurement or preparatory steps. In an embodiment, one or more of the multiple substrate stages is replaced by a measurement stage. A measurement stage includes at least a part of one or more sensor systems such as a sensor detector and/or target of the sensor system but does not support a substrate. The measurement stage is positionable in the projection beam in place of a substrate stage or a support structure for a patterning device. In a multiple support stages apparatus, the additional stages may be used in parallel, or preparatory steps may be carried out on one or more stages while one or more other stages are being used for exposure.

Figure 2:
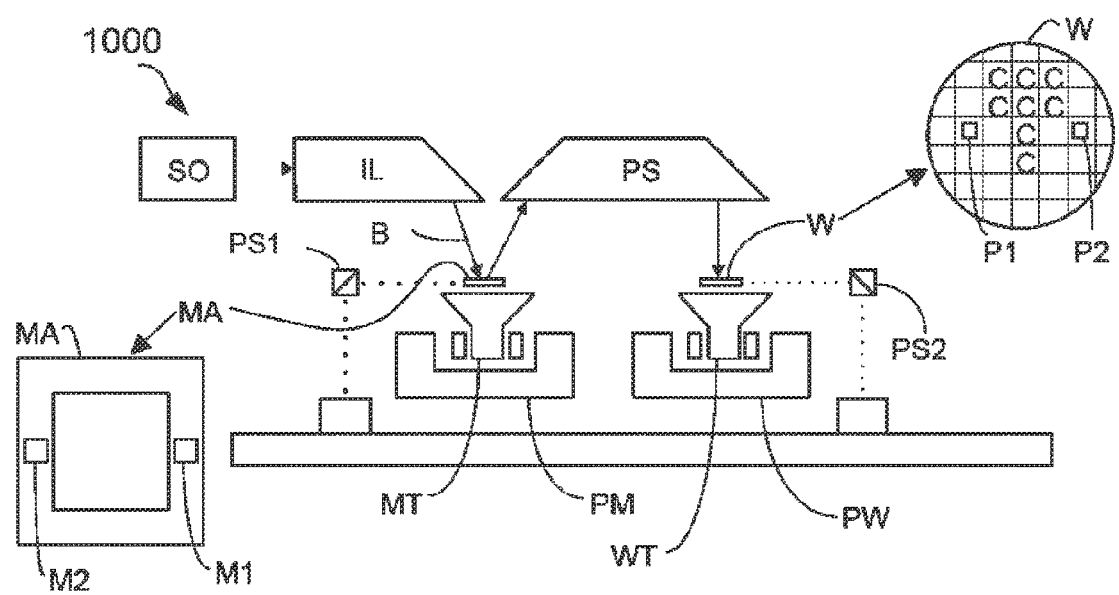
FIG. 2 is a schematic diagram of another lithographic apparatus.

FIG. 2 schematically depicts another exemplary lithographic apparatus 1000. The lithographic apparatus 1000 includes:

an illumination system (illuminator) IL configured to condition a radiation beam B (e.g., EUV radiation).

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist coated wafer) W and connected to a second positioner PW configured to accurately position the substrate; and a projection system (e.g., a reflective projection system) PS configured to project a pattern imparted to the radiation beam B by patterning device MA onto a target portion C (e.g., including one or more dies) of the substrate W.

The lithographic apparatus 1000 may further include a source collector module SO.

As here depicted, the apparatus 1000 is of a reflective type (e.g., employing a reflective mask). It is to be noted that because most materials are absorptive within the EUV wavelength range, the patterning device may have a multi-layer reflector including, for example, a multi-stack of molybdenum and silicon. In one example, the multi-stack reflector has a 40 layer pairs of molybdenum and silicon. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 2, the illuminator IL receives an extreme ultra violet (EUV) radiation beam from the source collector module SO. Methods to produce EUV radiation include, but are not necessarily limited to, converting a material that has at least one element, e.g., xenon, lithium or tin, with one or more emission lines in the EUV range, into a plasma state. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 2, to provide the laser beam to excite the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system including, for example, suitable directing mirrors and/or a beam expander. In other cases the source may be an integral part of the source collector module, for example when the source is a discharge produced plasma EUV generator, often termed as a DPP source.

The illuminator IL may include an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using patterning device alignment marks M1, M2 and substrate alignment marks P1, P2.

The depicted apparatus could be used in at least one of the following modes:

1. In step mode, the support structure (e.g., mask table) MT and the substrate table WT are kept substantially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously in a given direction (the so-called "scan direction") while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept substantially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

In an EUV lithographic apparatus, it is desirable to use a vacuum or low pressure environment since gases can absorb too much radiation. A vacuum environment can therefore be provided to the whole beam path with the aid of a vacuum wall and one or more vacuum pumps.

In an embodiment, a control system (not shown) controls the overall operations of the lithographic apparatus based on, for example, measurements from measurement devices. The control system can be embodied as a suitably-programmed general purpose computer including a central processing unit and volatile and non-volatile storage. Optionally, the control system may further include one or more input and output devices such as a keyboard and screen, one or more network connections and/or one or more interfaces to the various parts of the lithographic apparatus. It will be appreciated that a one-to-one relationship between controlling computer and lithographic apparatus is not necessary. In an embodiment, one computer can control multiple lithographic apparatuses. In an embodiment, multiple networked computers can be used to control one lithographic apparatus. The control system may also be configured to control one or more associated process devices and substrate handling devices in a lithocell or cluster of which the lithographic apparatus forms a part. The control system can also be configured to be subordinate to a supervisory control system of a lithocell or cluster and/or an overall control system of a fab.

Figure 3:
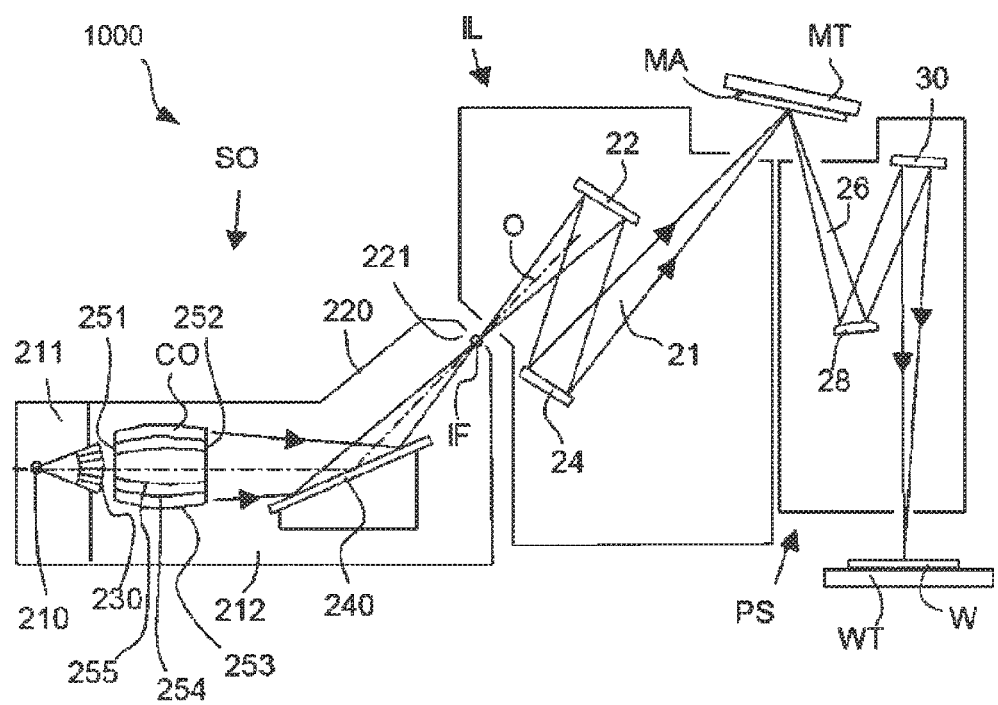
FIG. 3 is a more detailed view of the apparatus in FIG. 2.

FIG. 3 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be involved for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 3.

Collector optic CO, as illustrated in FIG. 3, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma source, often called a DPP source. Alternatively, the source collector module SO may be part of an LPP radiation system.

Figure 4:
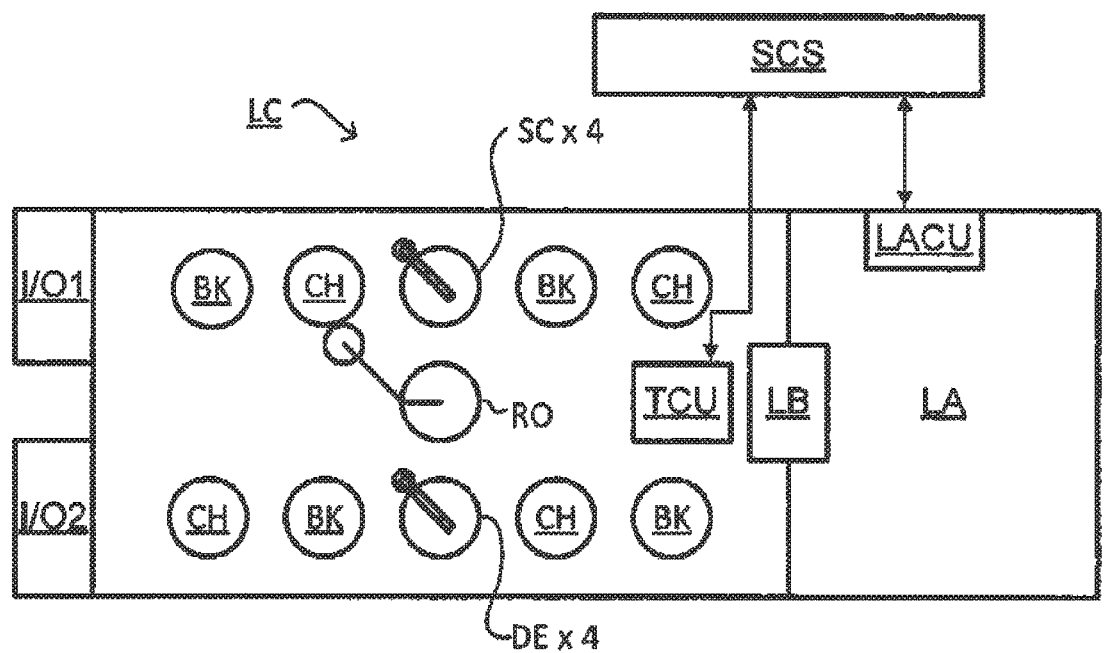
FIG. 4 schematically depicts an embodiment of a lithographic cell or cluster.

As shown in FIG. 4, the lithographic apparatus LA may form part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency. The lithographic cell LC may further includes one or more etchers to etch the substrate and one or more measuring devices configured to measure a parameter of the substrate. The measuring device may include an optical measurement device configured to measure a physical parameter of the substrate, such as a scatterometer, a scanning electron microscope, etc.

As described above, in an embodiment, an illuminated part of a patterning device is projected onto a part of a substrate via a projection system. In an embodiment, the projection system includes a plurality of optical elements. In an embodiment, one or more of those optical elements is reflective by design (e.g., a mirror). In an embodiment, the majority of the optical elements are reflective by design. In an embodiment, the projection system includes at least 4 reflective optical elements, at least 5 reflective optical elements, at least 6 reflective optical elements, at least 7 reflective optical elements, at least 8 reflective optical elements, at least 9 reflective optical elements, or at least 10 reflective optical elements.

To get a well-defined and/or positioned pattern on the substrate, the relative positioning of the optical elements, the patterning device and the substrate should be fairly well defined and stable. Thus, in an embodiment, one or more of the optical elements are movable by virtue of an actuator; in an embodiment, two or more, or the majority of the optical elements are movable. In an embodiment, the actuator is a mechanical or electro-mechanical actuator device. In an embodiment, the actuator is capable of moving the associated one or more optical elements in up to 2 degrees of freedom, up to 3 degrees of freedom, up to 4 degrees of freedom, up to 5 degrees of freedom, or in 6 degrees of freedom. Further, in an embodiment, those one or more optical elements have an associated optical element measurement system to measure the position and/or orientation (e.g., translation, rotation, etc.) of those one or more optical elements. In an embodiment, the measurement system is capable of measuring the position and/or orientation in up to 2 degrees of freedom, up to 3 degrees of freedom, up to 4 degrees of freedom, up to 5 degrees of freedom, or in 6 degrees of freedom. In an embodiment, the measurement system may include a single measurement device (e.g., interferometer or encoder) capable of measuring in the applicable number of degrees of freedom or may include a plurality of measurement devices (e.g., interferometers or encoders), each capable of measuring in one or more degrees of freedom so that the measurement system as a whole is capable of measuring in the applicable number of degrees of freedom.

In an embodiment, the optical elements of the projection system are carried or supported in a mechanical frame structure (hereinafter referred to as a force frame structure to distinguish from, e.g., a metrology frame structure described hereafter). In an embodiment, the force frame structure includes a plurality of separate frames. In an embodiment, the force frame structure includes a single integrated frame. In an embodiment, one or more of the optical elements are movable and so are connected to the force frame structure via the associated actuator. Thus, reaction forces are generally concentrated into the force frame structure.

In an embodiment, a metrology frame structure is provided. The metrology frame structure is substantially mechanically isolated from the force frame structure and/or other external force sources. That is, the metrology frame structure is effectively isolated from external forces or vibrations from, e.g., the force frame structure. In an embodiment, the metrology frame structure can be supported on the force frame structure through, for example, an isolating device or structure (e.g., a damping structure, a spring structure, a force compensating structure, etc.). In an embodiment, the metrology frame structure is separately connected to ground from the force frame structure.

In an embodiment, the metrology frame structure carries or supports one or more parts of an optical element measurement system. In an embodiment, the metrology frame structure can act as a stable structure relative to which the positions of a plurality of the optical elements of the projection are related. Thus, for example, relative to the metrology frame, the 6 degrees of freedom position of (a plurality of, most of, etc.) the optical elements is measured using one or more measurement systems.

With increased advancement of lithographic apparatuses, it desired to have projection systems with, e.g., increased numerical aperture. Where, for example, the projection system is a reflective design, this can lead to larger reflective optical elements, more reflective optical elements, different reflective optical element types, and/or larger reflective optical element distances (e.g., distances between reflective optical elements). But, similar issues may arise for transmissive optical designs.

So, in an embodiment, the distances between optical elements and the locations where the metrology frame has to deliver reference for optical element position and/or orientation measurement can increase, e.g., from a several centimeters to 1, 2 or more meters. Accordingly, the metrology frame could just be scaled to try to keep the distances at a few centimeters to a meter. But such scaling can mean more mass with a tendency to lower internal resonance frequencies of the metrology frame. Additionally or alternatively, the dynamic demands on optical element positioning and thus the metrology frame can also grow due to a smaller exposure slit size (e.g., from higher NA) and/or higher speed during exposure (e.g., throughput). Thus, a higher resonance frequency of the metrology frame is desired.

Figure 5A:
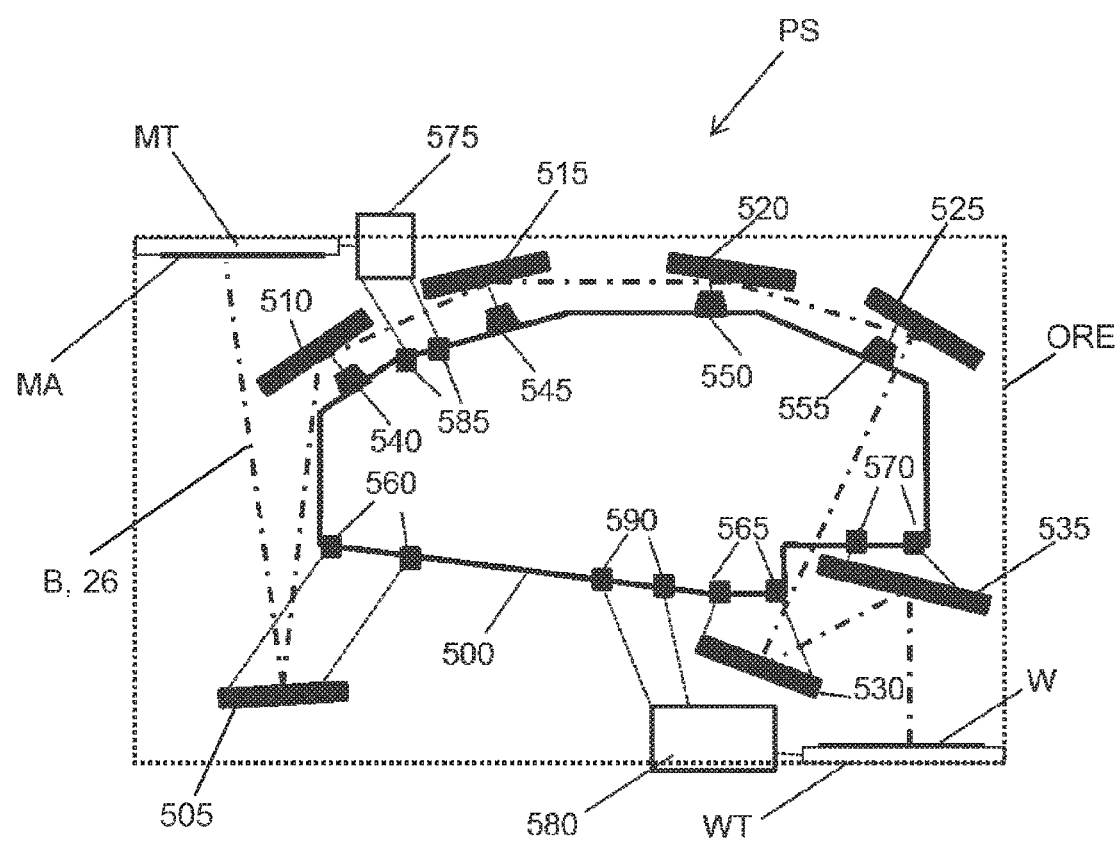
FIG. 5A is a schematic diagram of an embodiment of patterning device stage, of a projection system and of a substrate stage, of a lithographic apparatus.
Figure 5B:
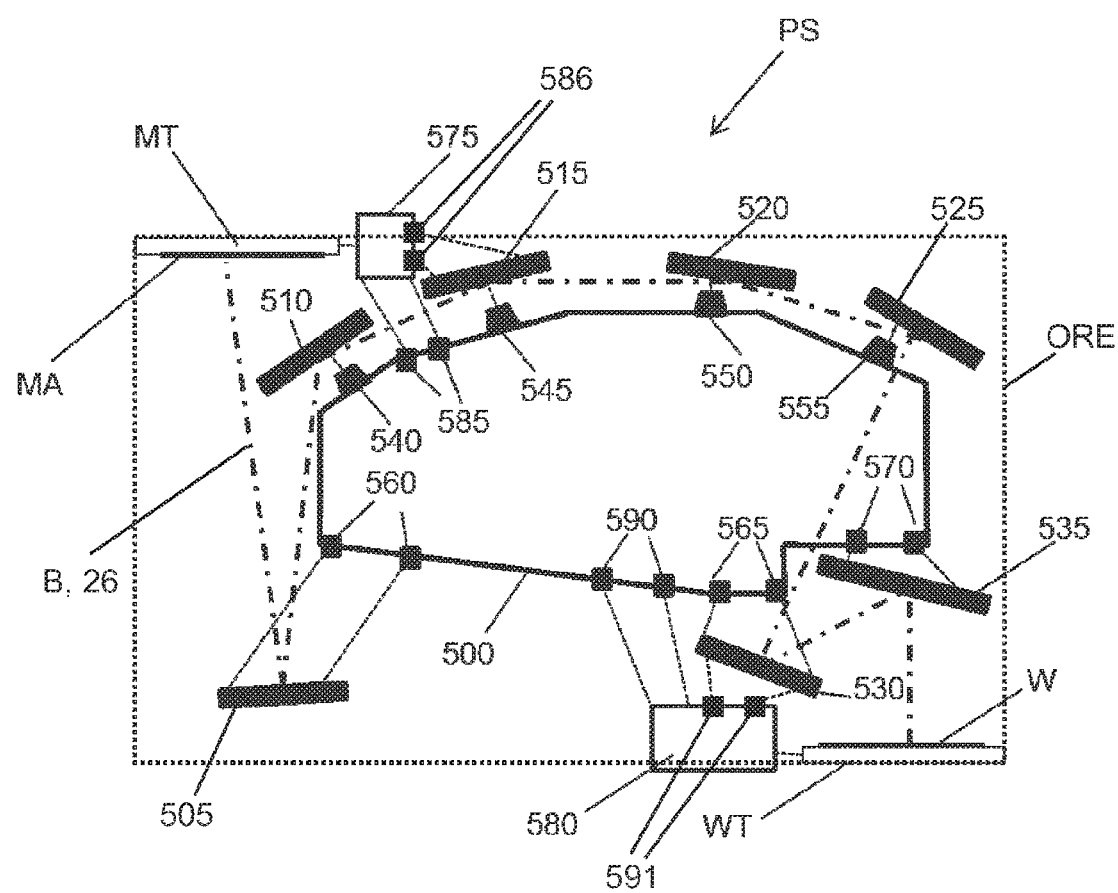
FIG. 5B is a schematic diagram of a second embodiment of patterning device stage, of a projection system and of a substrate stage, of a lithographic apparatus.

Referring to FIG. 5A and FIG. 5B, a schematic diagram of an embodiment of patterning device stage MT, of a projection system PS and of a substrate stage WT, of a lithographic apparatus is presented that aims to address one or more of the issues identified herein and/or elsewhere in the art. The figures and their application examples are substantially identical, which is why the figures will be explained together in the following, except for their differences.

In an embodiment, the projection system PS includes a plurality of optical elements. In FIG. 5A and FIG. 5B, all the optical elements are depicted as reflective optical elements. But, the optical elements in FIG. 5A and FIG. 5B do not all need to be reflective. One or more of the optical elements may be transmissive. Indeed, all the optical elements could be transmissive.

In FIG. 5A and FIG. 5B, the optical elements include an optical element 505, optical element 510, optical element 515, optical element 520, optical element 525, optical element 530 and optical element 535. As seen in FIG. 5A and FIG. 5B, those optical elements act to provide the beam B, 26 from the patterning device MA to the substrate W. In an embodiment, those optical elements are supported by a force frame structure (not shown for clarity of presentation), which may include a single frame or multiple separate frames. Further, each of those optical elements are connected to associated actuator (not shown for clarity of presentation), which in an embodiment, are connected to the force frame structure. While seven optical elements are depicted in FIG. 5A and FIG. 5B, a different number of optical elements can be provided.

In order to guide the beam B, 26 with minimal losses it can be beneficial if at least two, at least three, at least four, at least five, at least six or all of the optical elements 505-535 are designed as grazing incidence mirrors, which enables a flat beam path. In the example of FIG. 5A and FIG. 5B, the optical elements 510-525 are exemplarily designed as grazing incidence mirrors.

In an embodiment, a metrology frame structure 500 is provided. In an embodiment, the metrology frame structure 500 is a single frame. That is, a single frame can include a single part (monolithic design) or include multiple parts rigidly or stiffly connected to each other (e.g., bolted, welded, riveted, etc. together) so as to act as a single frame. In an embodiment, the metrology frame structure is limited in size. For example, the length is less than or equal to 5 meters, less than or equal to 4 meters, less than or equal to 3 meters, or less than or equal to 2 meters. In an embodiment, the frame has a ratio of frame length:thickness:width of about 2:1:1. In an embodiment, the metrology frame structure has a resonance frequency higher than or equal to 300 Hz, desirably in the range of 500-1000 Hz. In an embodiment, the metrology frame structure 500 is mostly made of a ceramic. In an embodiment, the metrology frame structure 500 is mostly made of a metal.

In an embodiment, the metrology frame structure 500 acts as a relative positioning reference for optical element position and/or orientation measurement. That is, the position and/or orientation of one or more of the optical elements of the projection system PS is measured relative to the metrology frame structure. However, also one or more of the optical elements 505-535, the patterning device stage MT, the substrate stage WT and/or an outer structure (c.f., FIG. 6) outside of the projection system PS can act as a relative positioning reference for the optical element positioning measurement for some applications. In general also more than one reference can be used, e.g., a single reference being a reference for only a first part (section) of the measured degrees of freedom (DOF), while another reference is a reference for a second part (section) of the degrees of freedom.

In an embodiment, the metrology frame structure 500 holds one or more parts of the one or more optical element measurement systems. In an embodiment, the metrology frame structure holds one or more parts of a plurality of optical element measurement systems, each optical element measurement system configured to measure the position and/or orientation of a respective optical element. In an embodiment, the one or more optical element measurement systems are configured to measure the position and/or orientation optically, i.e., use radiation to determine the position.

In an embodiment, the metrology frame structure 500 supports a part of two different types of optical element measurement system. Advantageously, a mixture of types of optical element measurement system enables the metrology frame structure 500 to be, e.g., relatively compact and/or have a relatively high resonance frequency.

However, it can also be advantageous to use a single type of optical element measurement system. Preferably the one or more optical element measurement systems can all be designed as interferometer measurement systems (not shown in FIG. 5A and FIG. 5B).

In an embodiment, the metrology frame structure 500 supports a part of an optical encoder system to measure an optical element relatively close to the metrology frame structure 500 and supports a part of an optical interferometer system to measure an optical element relatively far from the metrology frame structure 500. In an embodiment, relatively close is within 5 centimeters, within 4 centimeters, within 3 centimeters, within 2 centimeters, or within 1 centimeter. For example, in an embodiment, the relatively close distance is selected from the range of 2-20 mm. In an embodiment, relatively far is greater than or equal to 5 centimeters, greater than or equal to 7 centimeters, greater than or equal to 10 centimeters, greater than or equal to 15 centimeters or greater than or equal to 20 centimeters. In an embodiment, the relatively far distance is less than or equal 3 meters, less than or equal to 2 meters, or less than or equal to 1 meter. For example, in an embodiment, the relatively far distance is selected from the range of 5-10 cm. Thus, in an embodiment, one or more of the optical elements can be located at a relatively far distance from the metrology frame structure 500 (and be measured using an interferometer system), while one or more other optical elements can be located at a relatively close distance to the metrology frame structure 500 (and be measured using an encoder system). Accordingly, an appropriately selected metrology frame structure 500 can be used that can enable appropriate bridging of the distances between metrology frame structure 500 and the optical elements and achieve stable relative optical element positioning.

So, referring to FIG. 5A and FIG. 5B, in an embodiment, the metrology frame structure 500 includes a part 540 of an encoder system to measure the position and/or orientation of optical element 510, a part 545 of an encoder system to measure the position and/or orientation of optical element 515, a part 550 of an encoder system to measure the position and/or orientation of optical element 520, and a part 555 of an encoder system to measure the position and/or orientation of optical element 525. In an embodiment, the part of an encoder system supported on the metrology frame structure 500 is a sensor, a read-head or an optical element designed to redirect the encoder optical information to a sensor or read-head; in which case, the optical element supports the encoder scale or grating. In an embodiment, the part of an encoder system supported on the metrology frame structure 500 is an encoder scale or grating; in which case, the optical element supports a sensor, a read-head or an optical element designed to redirect the encoder optical information to a sensor or read-head. In an embodiment, an output to supply radiation for the encoder system (which may be a radiation source itself or be connected to a radiation source) can be provided where appropriate, which may be on the metrology frame structure 500, on the applicable optical element or elsewhere. For each of parts 540-555, a dashed line is shown in FIG. 5A and FIG. 5B to show transfer of optical information via, e.g., a measurement beam.

Referring to FIG. 5A and FIG. 5B again, in an embodiment, the metrology frame structure 500 includes a part 560 of an interferometer system to measure the position and/or orientation of optical element 505, a part 565 of an interferometer system to measure the position and/or orientation of optical element 530, and a part 570 of an interferometer system to measure the position and/or orientation of optical element 535. In an embodiment, the part of an interferometer system supported on the metrology frame structure 500 is a sensor or an optical element designed to redirect the interferometer optical information to a sensor; in which case, the optical element supports a reflective surface to receive the interferometer beam. In an embodiment, the part of an interferometer system supported on the metrology frame structure 500 is a reflective surface to receive the interferometer beam; in which case, the optical element supports a sensor or an optical element designed to redirect the interferometer optical information to a sensor. In an embodiment, an output to supply radiation for the interferometer system (which may be a radiation source itself or be connected to a radiation source) can be provided where appropriate, which may be on the metrology frame structure 500, on the applicable optical element or elsewhere. For each of parts 560-570, a dashed line is shown in FIG. 5A and FIG. 5B to show transfer of optical information via, e.g., a measurement beam.

Optionally, the metrology frame structure 500 can be used to measure a position and/or orientation between the metrology frame structure 500 and a patterning device metrology frame 575 and/or between the metrology frame structure 500 and a substrate metrology frame 580. In an embodiment, the patterning device metrology frame 575 enables measurement of the position and/or orientation of the patterning device stage MT and/or the patterning device MA; the dashed line between the patterning device metrology frame 575 and the patterning device stage MT/patterning device MA signifies measurement of the position and/or orientation of the patterning device stage MT/patterning device MA relative to the patterning device metrology frame 575.

FIG. 5B shows an extension of this principle, wherein sensor part 585 belongs to a measurement system to measure a first section of six degrees of freedom of the position and/or orientation of the patterning device metrology frame structure 575 and the optical element 515 (or the optical element 510) includes a further part of a measurement system (not shown) to measure a second part of the six degrees of freedom of the position and/or orientation of the patterning device metrology frame structure 575. The further part of the measurement system of optical element 515 can be preferably a reflector for an interferometer sensor part 586, located on the patterning device metrology frame 575.

Similarly, the substrate metrology frame 580 enables measurement of the position and/or orientation of the substrate stage WT and/or the substrate W; the dashed line between the substrate metrology frame 580 and the substrate stage WT/substrate W signifies measurement of the position and/or orientation of the substrate stage WT/substrate W relative to the substrate metrology frame 580. So, by measuring the position and/or orientation of the patterning device metrology frame 575 relative to the metrology frame structure 500 and the position and/or orientation of the substrate metrology frame 580 relative to the metrology frame structure 500, an appropriate relative position and/or orientation between the patterning device MA, one or more the optical elements 505-535 and the substrate W can be determined (through the measurement systems) and controlled (by engaging one or more appropriate actuators associated with the patterning device MA, the substrate W and/or one or more of the optical elements 505-535).

Again, FIG. 5B shows an extension of this concept, wherein the part 590 belongs to a measurement system to measure a first section of six degrees of freedom of the position and/or orientation of the substrate metrology frame structure 580 and optical element 530 includes a further part of a measurement system, e.g., a reflector part (not shown) to measure a second section of the six degrees of freedom of the position and/or orientation of the substrate metrology frame structure 580.

In an embodiment, the sensor system for the patterning device metrology frame 575 and/or substrate metrology frame 580 can be an encoder or an interferometer. The location of the pertinent parts for such encoders or interferometers can be similar to as described for the optical element measurement system (e.g., a part on the frame and another part on the substrate/patterning device stage as appropriate).

So, referring to FIG. 5A and FIG. 5B, in an embodiment, the metrology frame structure 500 includes a part 585 of an interferometer system to measure the position and/or orientation of the patterning device metrology frame 575 and a part 590 of an interferometer system to measure the position and/or orientation of the substrate metrology frame 580. In an embodiment, the part of an interferometer system supported on the metrology frame structure 500 is a sensor or an optical element designed to redirect the interferometer optical information to a sensor; in which case, the patterning device metrology frame 575 or substrate metrology frame 580 supports a reflective surface to receive the interferometer beam. In an embodiment, the part of an interferometer system supported on the metrology frame structure 500 is a reflective surface to receive the interferometer beam; in which case, the patterning device metrology frame 575 or substrate metrology frame 580 supports a sensor or an optical element designed to redirect the interferometer optical information to a sensor. In an embodiment, an output to supply radiation for the interferometer system (which may be a radiation source itself or be connected to a radiation source) can be provided where appropriate, which may be on the metrology frame structure 500, on the applicable patterning device metrology frame 575 or substrate metrology frame 580 or elsewhere. For each of parts 585 and 590, a dashed line is shown in FIG. 5A and FIG. 5B to show transfer of optical information via, e.g., a measurement beam. The substrate metrology frame 580 and/or the patterning device metrology frame 575 with one or more of the features described regarding FIGS. 5A/5B may optionally also be part of the third embodiment according to FIG. 6.

In FIG. 5A and FIG. 5B, each of parts 560, 565, 570, 585, 586, 590 and 591 is depicted as having two measurement beams to show multiple degree of freedom measurement. But, having multiple beams is not necessary.

In an embodiment, the lithographic apparatus (e.g., the metrology frame structure) is equipped with one or more selected from the following hardware for an optical element position and/or orientation measurement interferometer system: relevant beam delivery, beam splitting, beam bending, beam polarization cleaning, one or more beam adjustment manipulators to control range, measurement beam wavelength tracking equipment, refractive index determination equipment, a zeroing system, local and/or global beam-shielding from external influences such as gas flows (the shield need not be mounted to metrology frame structure), etc. In an embodiment, similar equipment can be provided for an optical element position and/or orientation measurement encoder system.

In an embodiment, the lithographic apparatus (e.g., remote from the metrology frame structure) is equipped with one or more selected from the following hardware for an optical element position and/or orientation measurement interferometer system: a radiation supply (e.g., a laser), electronics hardware and software for signal processing and computation (e.g., signal conditioning, position determination, position correction, metrology model, calibration model, etc.) for, e.g., real time (servo) and/or delayed calculations (drift compensation). In an embodiment, similar equipment can be provided for an optical element position and/or orientation measurement encoder system.

In an embodiment, a metrology model is provided to calibrate the interferometer system by calibrating relative to one or more reference positions (zeroing) calibrated using another measurement system (e.g., by using images of test patterns measured using another optical measurement system).

Thus, in an embodiment, there is provided relatively large distance multiple degree of freedom optical element position and/or orientation measurement (with, for example, accuracy at a picometer level) using one or more interferometers for, e.g., mirrors of an EUV projection system. In an embodiment, a single metrology frame is provided that has a high resonant frequency while enabling measurement of one or more optical elements relatively far from the metrology frame. In an embodiment, the metrology frame structure allows significant free space between certain optical elements (e.g., optical elements 530 and 535) and the metrology frame structure to allow more design space/freedom, while still being able to measure those optical elements with high accuracy.

Figure 6:
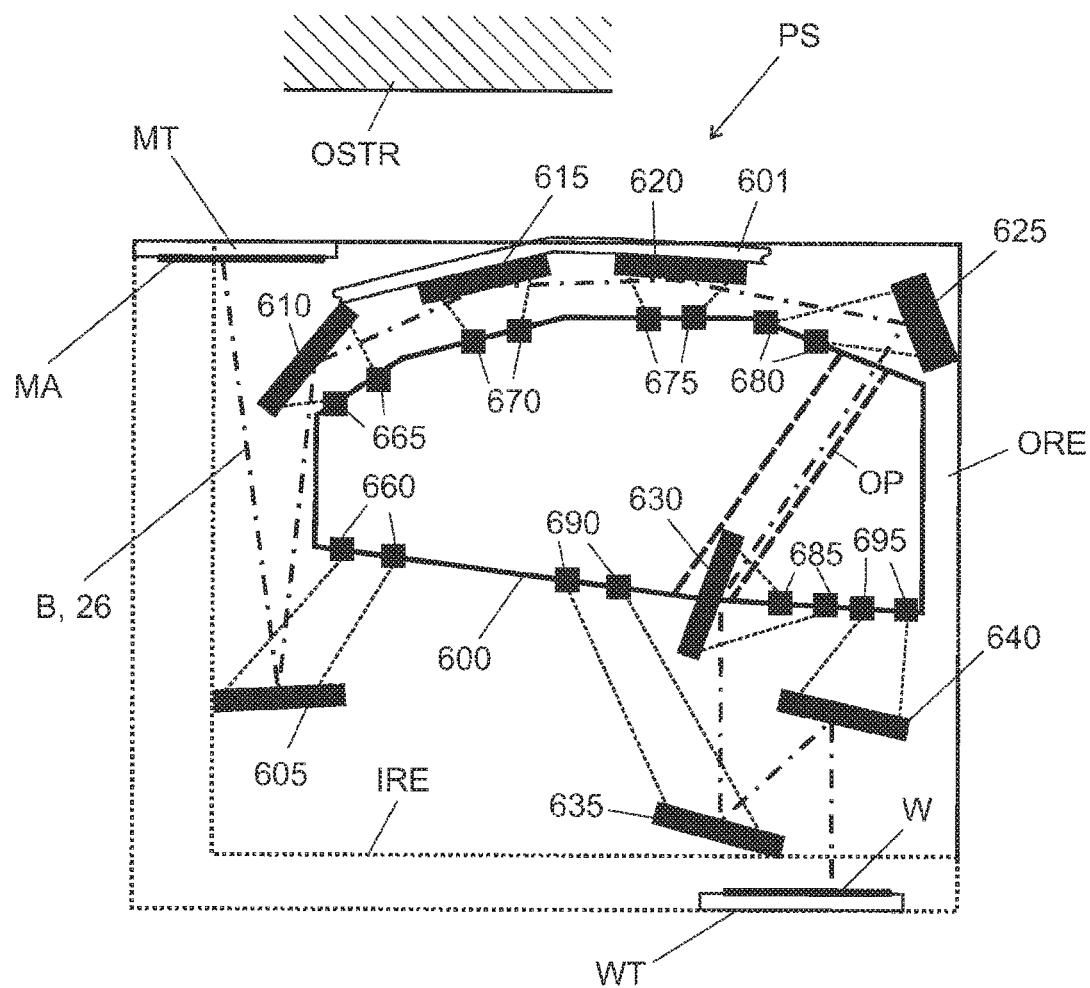
FIG. 6 is a schematic diagram of a third embodiment of pattering device stage, of a projection system and of a substrate stage, of a lithographic apparatus.

Referring to FIG. 6, a schematic diagram of another embodiment of a patterning device stage MT, of a projection system PS, and of a substrate stage WT, of a lithographic apparatus is shown. The application example is similar to the one shown in FIG. 5A and FIG. 5B, which is why especially features of these application examples can be interchanged by the person skilled in the art easily. As FIGS. 5A/5B and 6 are similar, referring to FIG. 6 especially the differences to FIG. 5A and FIG. 5B will be described in the following.

FIG. 6 shows a projection system PS of a lithographic apparatus, including a plurality of optical elements 605-640 which is configured to project a beam B, 26 of radiation onto a radiation sensitive substrate W. The projection system PS further includes a metrology frame structure 600 including a part 660-695 of optical element measurement systems to measure the position and/or orientation of at least one of the optical elements 605-640. The plurality of optical elements 605-640, a patterning device stage MT, and a substrate stage WT are arranged such that in a two dimensional view on the projection system PS a rectangle ORE ("outer rectangle") is defined such that it envelops the plurality of optical elements 605-640, the patterning device stage MT, and the substrate stage WT. The rectangle ORE is further defined as small as possible, wherein the metrology frame structure 600 is positioned within the rectangle ORE. The rectangle ORE is also shown in the application examples of FIG. 5A and FIG. 5b.

In addition, the plurality of optical elements 605-640 is even arranged such that in the two dimensional view on the projection system PS an inner rectangle IRE is defined such that it envelops the plurality of optical elements 605-640. The inner rectangle IRE is further also defined as small as possible, wherein the metrology frame structure 600 is positioned within the inner rectangle IRE.

Referring to the two dimensional view, the two dimensional view is a view of the projection system PS wherein the path of the beam B, 26 of radiation from the patterning device stage MT to the substrate stage WT can be seen in total. A side view on the beam B, 26 of radiation from the patterning device stage MT to the substrate stage WT can be seen. Commonly, the beam B, 26 of radiation would proceed in a "flat" way, potentially even in a plane. In this case the two dimensional view is a view on the plane in within the major part or the entire part of the beam B, 26 of radiation proceeds from the patterning device stage MT to the substrate stage WT.

The plurality of optical elements 605-640 further includes an outer group of optical elements 605-625, 635, 640 which is positioned to surround the metrology frame structure 600. FIG. 6 shows a projection system PS wherein the plurality of optical elements 605-640 includes eight optical elements 605-640—however the disclosure is neither limited to this number nor the number of optical elements shown in FIG. 5A and FIG. 5B. The disclosure can advantageously be realized with an arbitrary number of optical elements, e.g., with at least two, at least three, at least four, at least five, at least six, at least seven, at least eight, at least nine, at least ten or even more optical elements.

Herein, the disclosure is mainly discussed regarding a projection system PS which is designed for EUV radiation. However, any other projection system which can be used for arbitrary wavelength of radiation can also be used. Therefore, optical elements of the projection system PS can in general be reflective or permeable—preferably the optical elements or at least the plurality of optical elements is reflective, e.g., designed as mirrors, as shown in FIG. 5A, FIG. 5B, and FIG. 6.

As already mentioned, FIG. 5A, FIG. 5B, and FIG. 6 show a two dimensional view on the metrology frame structure 500, 600. Thereby it can be seen that the metrology frame structure 500, 600 is positioned within the outer group of optical elements 505-535; 605-625, 635, 640, wherein the outer group of optical elements 505-535; 605-625, 635, 640 is positioned to surround the metrology frame structure 500, 600.

The outer group of optical elements 605-625, 635, 640 contains seven of the optical elements 605-640 but might in general also contain more or all of the optical elements 605-640. In FIG. 6, the majority of optical elements 605-640 is contained by the outer group of optical elements 605-625, 635, 640.

As can be seen from FIG. 6, the metrology frame structure 600 includes an opening OP which is configured to let the beam B, 26 of radiation pass through the metrology frame structure 600. This can, e.g., be achieved by designing the metrology frame structure 600 in the form of a torus or a ring—in FIG. 6 the opening OP is shown in a highly abstract way, just for clarification.

Furthermore, an inner optical elements 630 is shown, which is at least partly positioned within the opening OP of the metrology frame structure 600. In general the projection system PS can even contain an inner group of optical elements. The inner group may contain at least one, at least two, at least three, at least four or even more of the optical elements 605-640 but preferably only a minor part of the optical elements 605-640.

As was already explained regarding FIG. 5A and FIG. 5B, the one or more optical element measurement systems can be configured to measure the position and/or orientation of the at least one of the optical elements 505-535, 605-640 optically. Therefore, the majority or all (as is the case for FIG. 6) optical element measurement systems can be designed as interferometer systems.

In order to guide the beam, B, 26 through the projection system PS, a flat beam path can be preferred. If this is the case, it can be beneficial if the majority or the entire plurality of optical elements 505-535, 605-640 is designed as grazing incidence mirrors. In FIG. 6, the optical elements 615, 620, 630 are designed as grazing incidence mirrors, just as an example.

As can be seen in FIG. 6, the plurality of optical elements 605-640 can be supported by one or more force frame structures 601, wherein the force frame structures 601 are independent of the metrology frame structure 600. For simplification, only a part of a force frame structure 601 is shown in FIG. 6.

As was already discussed before, the metrology frame structure 500, 600 may be a single frame, e.g., realized with a single part or including multiple parts rigidly or stiffly connected to each other. Preferably, the metrology frame structure 600 is realized as lightweight design and is, e.g., designed as a hollow structure. The presentations in FIG. 5A, FIG. 5B, and FIG. 6 have to be understood as schematic illustration only.

Commonly a reference for the measurement of position and/or orientation of the optical elements 605-640 is used. First of all, the metrology frame structure 600 can act as such a relative positioning reference for the optical element positioning measurement. Furthermore, also one or more of the optical elements 605-640, the patterning device stage MT, the substrate stage WT and/or an outer structure OSTR outside of the projection system PS can act as a relative positioning reference for the optical element positioning measurement for some applications.

It can be beneficial, if the metrology frame structure 500, 600 is cooled. A controlled temperature environment can further improve the measurement.

The interferometer measurement systems of FIG. 6 can be designed for measurements in one or more degrees of freedom. The interferometer measurement systems can further include one or more of the following features: relevant beam delivery, fiber feeding, beam splitting, beam bending, beam polarization cleaning, one or more beam adjustment manipulators and/or targets/provisions to control range, measurement beam wavelength tracking equipment, refractive index determination equipment, a zeroing system and/or local and/or global beam-shielding from external influences such as gas flows.

The metrology frame structure 600 can have a resonance frequency greater than or equal to 400 Hz. High resonance frequencies can be advantageous to improve the measurements.

Preferably, a gap distance from the metrology frame structure 600 to the at least one optical element 605-640 measured with the interferometer measurement system is five or more centimeters.

In general, the metrology frame structure 600 can have a length of less than or equal to three meters.

A computer system can assist in implementing methods and flows disclosed herein. A computer system can include a bus or other communication mechanism to communicate information, and a processor (or multiple processors) coupled with the bus to process information. The computer system may also include a main memory, such as a random access memory (RAM) or other dynamic storage device, coupled to the bus to store and/or supply information and instructions to be executed by processor. Main memory may be used to store and/or supply temporary variables or other intermediate information during execution of instructions to be executed by the processor. The computer system may further include a read only memory (ROM) or other static storage device coupled to the bus to store and/or supply static information and instructions for the processor. A storage device, such as a magnetic disk or optical disk, may be provided and coupled to the bus to store and/or supply information and instructions. The computer system may be coupled via the bus to a display, such as a cathode ray tube (CRT) or flat panel or touch panel display, to display information to a computer user. An input device, including alphanumeric and other keys, may be coupled to the bus to communicate information and command selections to the processor. Another type of user input device may be cursor control, such as a mouse, a trackball, or cursor direction keys, to communicate direction information and command selections to the processor and to control cursor movement on the display. A touch panel (screen) display may also be used as an input device.

According to one embodiment, at least a portion of a process described herein may be performed by the computer system in response to the processor executing one or more sequences of one or more instructions contained in a storage (e.g., main memory). Execution of the sequences of instructions causes the processor to perform process steps described herein. One or more processors in a multi-processing arrangement may be employed to execute the sequences of instructions. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to the processor for execution. Such a medium may take many forms, including but not limited to, non-volatile media, volatile media, and transmission media. Non-volatile media include, for example, optical or magnetic disks. Volatile media include dynamic memory. Transmission media include coaxial cables, copper wire and fiber optics, including the wires that include bus. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

The computer system may include a communication interface coupled to the bus. The communication interface provides a two-way data communication coupling to a network link that is connected to a network or to another computing device (e.g., a computing device in the lithographic apparatus). For example, the communication interface may provide a wired or wireless data communication connection. In any such implementation, the communication interface sends and receives electrical, electromagnetic or optical signals that carry digital data streams representing various types of information.

The computer system can send messages and receive data, including program code, through the network(s), network link, and communication interface. In an Internet example, a server might transmit a (requested) code for an application program through the network (e.g., Internet) and communication interface. One such downloaded application may provide for the code to implement a method herein, for example. The received code may be executed by the processor as it is received, and/or stored in a storage device, or other non-volatile storage for later execution. In this manner, the computer system may obtain application code in the form of a carrier wave.

In an embodiment, the lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, is desirably submerged in liquid, but rather only means that liquid is located between the projection system and the substrate during exposure.

The concepts disclosed herein may be used with any device manufacturing process involving a lithographic apparatus, and may be especially useful with emerging imaging technologies capable of producing wavelengths of an increasingly smaller size. Emerging technologies already in use include deep ultraviolet (DUV) lithography that is capable of producing a 193 nm wavelength with the use of an ArF laser, and even a 157 nm wavelength with the use of a fluorine laser. Moreover, EUV lithography is capable of producing wavelengths within a range of 5-20 nm.

While the concepts disclosed herein may be used for device manufacturing on a substrate such as a silicon wafer, it shall be understood that the disclosed concepts may be used with any type of lithographic systems, e.g., those used for patterning of substrates other than silicon wafers.

As noted, microlithography is a significant step in the manufacturing of devices such as ICs, where patterns formed on substrates define functional elements of the ICs, such as microprocessors, memory chips etc. Similar lithographic techniques are also used in the formation of flat panel displays, micro-electro mechanical systems (MEMS) and other devices. Thus, although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion".

In the present document, the terms "radiation" and "beam" are used to encompass all types of electromagnetic radiation, including ultraviolet radiation (e.g., with a wavelength of 365, 248, 193, 157 or 126 nm) and EUV (extreme ultra-violet radiation, e.g., having a wavelength in the range 5-20 nm).

Although specific reference may have been made above to the use of embodiments in the context of optical lithography, it will be appreciated that an embodiment of the disclosure may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. Thus, a lithographic apparatus using the imprint technology typically include a template holder to hold an imprint template, a substrate table to hold a substrate and one or more actuators to cause relative movement between the substrate and the imprint template so that the pattern of the imprint template can be imprinted onto a layer of the substrate.

The descriptions above are intended to be illustrative, not limiting. Thus, it will be apparent to one skilled in the art that modifications may be made as described without departing from the scope of the claims set out below.

What is claimed is:

1. A lithographic apparatus, comprising:
   a projection system comprising a plurality of optical elements configured to project a beam of radiation onto a radiation sensitive substrate;
   a metrology frame structure; and
   a plurality of measurement systems,
   wherein:
   the optical elements comprise a grazing incidence mirror;
   each measurement system is configured to measure a position and/or an orientation of a corresponding optical element of the plurality of optical elements;
   each measurement system comprises a part that is disposed in the metrology frame structure;
   the plurality of optical elements, a patterning device stage, and a substrate stage are configured so that, in a two dimensional view on the projection system, a rectangle envelops the plurality of optical elements, the patterning device stage, and the substrate stage;
   the metrology frame structure is positioned within the rectangle; and
   the plurality of optical elements comprises an outer group of optical elements surrounding the metrology frame structure.

2. The apparatus of claim 1, wherein:
   the plurality of optical elements is configured so that, in the two dimensional view on the projection system, an inner rectangle envelops the plurality of optical elements;
   the inner rectangle is as small as possible; and
   the metrology frame structure is within the inner rectangle.

3. The apparatus of claim 1, wherein the two dimensional view is a view of the projection system, and the path of the beam of radiation from the patterning device stage to the substrate stage is viewable in total.

4. The apparatus of claim 1, wherein the two dimensional view is a view of the projection system, and a side view on the beam of radiation from the patterning device stage to the substrate stage is viewable.

5. The apparatus of claim 1, wherein the two dimensional view is a view on a plane within a major part or the entire part of the beam of radiation proceeding from the patterning device stage to the substrate stage.

6. The apparatus of claim 1, wherein the outer group of optical elements comprises at least four of the optical elements.

7. The apparatus of claim 1, wherein the outer group of optical elements comprises most or all of the optical elements.

8. The apparatus of claim 1, wherein the metrology frame structure has an opening to let the beam of radiation pass through the metrology frame structure.

9. The apparatus of claim 8, wherein the plurality of optical elements comprises an inner group of optical elements at least partly positioned within the opening of the metrology frame structure.

10. The apparatus of claim 1, wherein the one or more optical element measurement systems is/are configured to optically measure the position and/or the orientation of the at least one of the optical elements.

11. The apparatus of claim 1, wherein the majority or all optical element measurement systems are designed as interferometer systems.

12. The apparatus of claim 1, wherein the metrology frame structure comprises a part of two different types of optical element measurement systems.

13. The apparatus of claim 1, wherein the optical element measurement systems comprise one or more optical encoder systems and one or more interferometer systems.

14. The apparatus of claim 1, wherein the metrology frame structure comprises a part of an encoder measurement system to measure the position and/or orientation of at least one of the optical elements, and the metrology frame comprises a part of an interferometer measurement system to measure the position and/or orientation of at least one other of the optical elements.

15. The apparatus of claim 1, wherein the plurality of optical elements is supported by one or more force frame structures, and the force frame structures are independent of the metrology frame structure.

16. The apparatus of claim 1, wherein the metrology frame structure is a single frame.

17. The apparatus of claim 1, wherein the optical elements comprise at least two grazing incidence mirrors.

18. The apparatus of claim 1, wherein:
   each optical element of the plurality of optical elements has a corresponding optical element measurement system;
   each optical measurement system comprises a part that is disposed within the metrology frame structure.

19. A device manufacturing method, comprising:
   projecting a beam of radiation onto a radiation sensitive substrate via a plurality of optical elements of a projection system; and
   using a plurality of measurement systems to measure a position and/or an orientation of at least one of the optical elements,
   wherein:
      the optical elements comprise a grazing incidence mirror;
      each measurement system is configured to measure the position and/or the orientation of a corresponding optical element of the plurality of optical elements;
      each measurement system comprises a part that is disposed in the metrology frame structure;
      the plurality of optical elements, a patterning device stage, and a substrate stage are arranged so that, in a two dimensional view on the projection system, a rectangle envelops the plurality of optical elements, the patterning device stage, and the substrate stage;
      the metrology frame structure is positioned within the rectangle; and
      the plurality of optical elements comprises an outer group of optical elements surrounding the metrology frame structure.

20. The method of claim 19, wherein the optical elements comprise at least two grazing incidence mirrors.

21. The method of claim 19, wherein:
   each optical element of the plurality of optical elements has a corresponding optical element measurement system; and
   each optical measurement system comprises a part that is disposed within the metrology frame structure.

* * * * *

UNITED STATES PATENT AND TRADEMARK OFFICE
CERTIFICATE OF CORRECTION

PATENT NO. : 10,908,508 B2
APPLICATION NO. : 16/688598
DATED : February 2, 2021
INVENTOR(S) : Loopstra et al.

It is certified that error appears in the above-identified patent and that said Letters Patent is hereby corrected as shown below:

In the Specification

Column 10, Line 49, before "for" delete "to".

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*